United States Patent
Miller et al.

(10) Patent No.: US 6,806,162 B1
(45) Date of Patent: Oct. 19, 2004

(54) METHOD FOR COMPOSING A DIELECTRIC LAYER WITHIN AN INTERCONNECT STRUCTURE OF A MULTILAYER SEMICONDUCTOR DEVICE

(75) Inventors: Gayle W. Miller, Colorado Springs, CO (US); Gail D. Shelton, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/459,072

(22) Filed: Jun. 11, 2003

Related U.S. Application Data

(62) Division of application No. 09/164,069, filed on Sep. 30, 1998, now Pat. No. 6,614,097.

(51) Int. Cl.[7] .............................................. H01L 21/76
(52) U.S. Cl. ...................... 438/409; 438/635; 438/637; 438/642; 438/762; 438/780
(58) Field of Search ................................ 438/409, 642, 438/635, 637, 762, 780

(56) References Cited

U.S. PATENT DOCUMENTS

| | | | |
|---|---|---|---|
| 5,804,508 A | * | 9/1998 | Gnade et al. |
| 5,958,510 A | * | 9/1999 | Sivaramakrishnam et al. |
| 6,008,540 A | * | 12/1999 | Lu et al. |

* cited by examiner

Primary Examiner—Long Pham
(74) Attorney, Agent, or Firm—Hitt Gaines PC

(57) ABSTRACT

A method for composing a dielectric layer within an interconnect structure of a multilayer semiconductor device is disclosed. A layer of silica precursor material is first deposited on a silicon substrate. Without affecting its structure and porosity, the layer of silica precursor material is then dried; and the layer of silica precursor material becomes porous silica film. Subsequently, a protective layer, such as parylene, is deposited on top of the dried porous silica film. The thickness of the protective layer should be greater than the peak-valley planarization requirements of the silicon substrate surface. As a result, a composite porous silica film, which services as a dielectric layer within an interconnect structure, is formed. This composite porous silica film has a relatively low dielectric constant and is able to withstand damage from a standard CMP procedure.

5 Claims, 2 Drawing Sheets

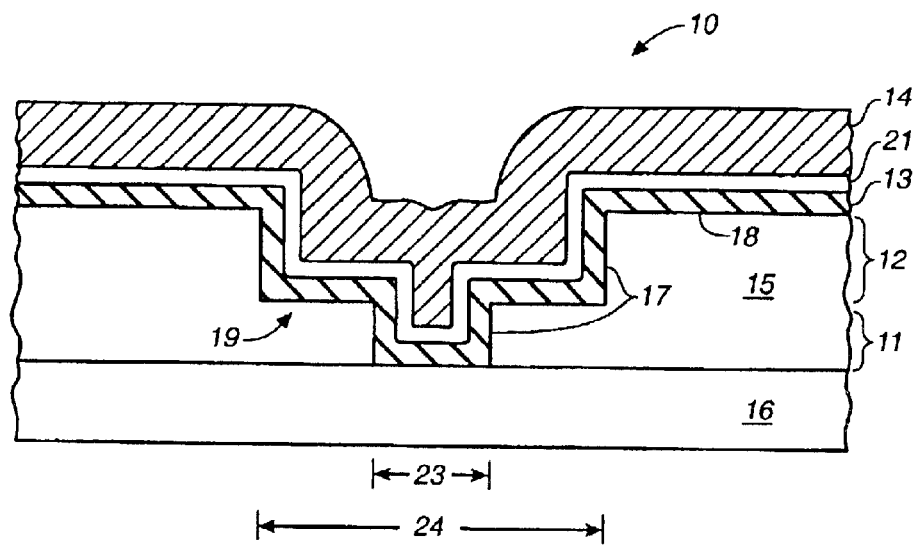
FIG._1
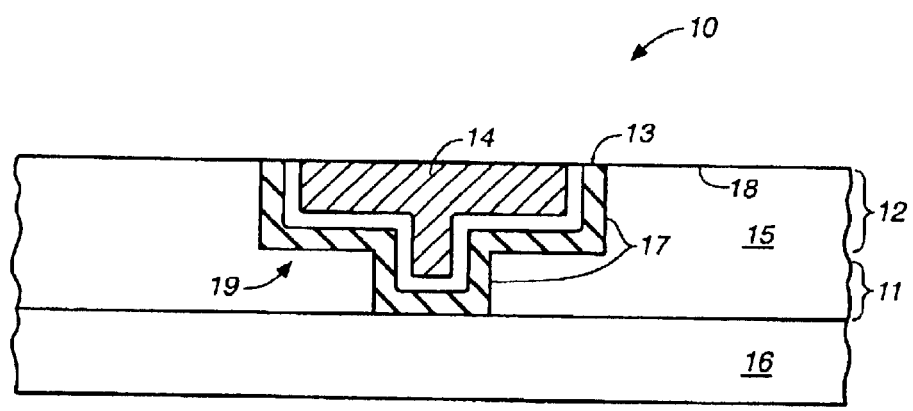
FIG._2

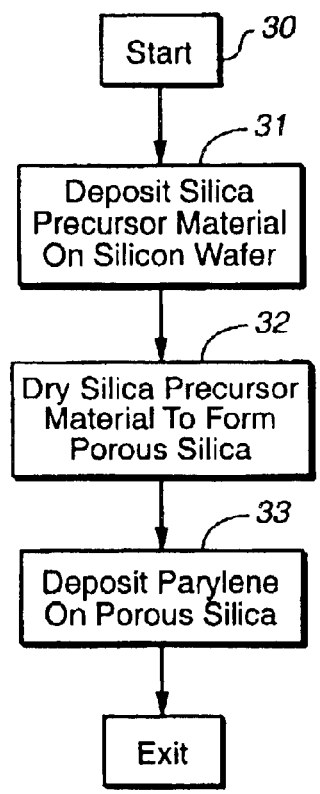
FIG._3
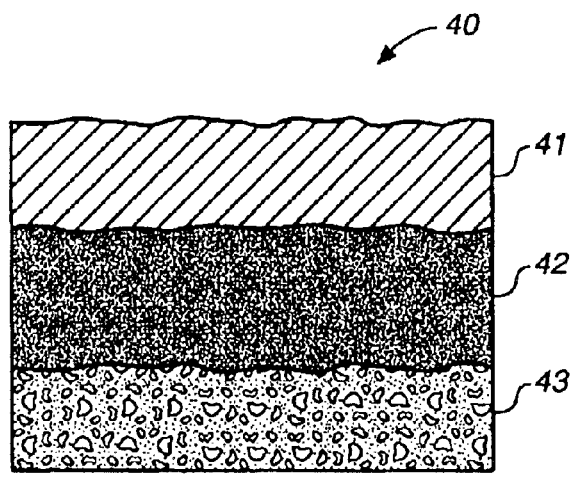
FIG._4

METHOD FOR COMPOSING A DIELECTRIC LAYER WITHIN AN INTERCONNECT STRUCTURE OF A MULTILAYER SEMICONDUCTOR DEVICE

This Application is a Divisional of prior application Ser. No. 09/164,069 filed on Sep. 30, 1998, now U.S. Pat. No. 6,614,097. The above-listed Application is commonly assigned with the present invention and is incorporated herein by reference as if reproduced herein in its entirety under Rule 1.53(b).

BACKGROUND OF THE INVENTION

1. Technical Field

The present invention relates to semiconductor devices in general, and in particular to a multilayer semiconductor device and a method for forming an interconnect structure within a multilayer semiconductor device. Still more particularly, the present invention relates to a multilayer semiconductor device and a method for composing a dielectric layer within an interconnect structure of a multilayer semiconductor device.

2. Description of the Prior Art

Within an integrated circuit (IC) device, various electrical components are formed on a semiconductor substrate. These electrical components are normally interconnected with metal lines that are typically formed by a combination of processes such as deposition, masking, and etching, commonly referred to as metalization.

Generally speaking, metalization begins at a masking area where small openings called vias are etched through all surface layers, down to the active regions of an IC device. Following a trench formation, a thin layer of conductive material is deposited by techniques such as vacuum evaporation, sputtering, or chemical vapor deposition (CVD). The unwanted portions of this layer of conductive material are then removed by a chemical-mechanical polishing (CMP) process. The CMP process leaves the surface layer covered with thin metal lines that are commonly known as interconnects.

A single-level interconnect structure such as the one described above is known as a single damascene structure. As chip density increases, a multi-level interconnect structure known as a dual damascene structure is generally more desirable. A multi-level interconnect structure typically begins with a standard metalization process that leaves the surface components partially wired together. Next, a layer of dielectric material such as an oxide, silicon nitride, or polyamide is deposited on the partially wired single damascene structure. Subsequently, a masking step that etches multiple vias down to a first level metal is performed on the dielectric layer to form a dual damascene structure.

Regardless of whether a single or dual damascene structure is being utilized, with the replacement of aluminum-alloy by copper as the source material for fabricating interconnects, the usage of a medium having a very low dielectric property (i.e., a dielectric constant of less than 2.5) to serve as a dielectric layer within the damascene structure is critical for the performance of IC devices. At one point, porous silica, such as aerogel or xerogel, was being considered by the semiconductor industry as a candidate for the dielectric medium because of its low dielectric constant. For example, bulk aerogel has a dielectric constant of approximately 1.0, and xerogel has a dielectric constant of approximately 1.7. However, despite its low dielectric constant, porous silica also has a very delicate, low density structure that possesses many microscopic voids. These microscopic voids make porous silica very fragile. In fact, porous silica is so fragile that a dielectric layer made of porous silica can easily be damaged by the CMP process utilized in conjunction with the damascene method of metalization.

Although alternative etching methods such as Subtractive Etching can be utilized instead of the CMP process for polishing a porous silica dielectric layer, these alternative etching methods are generally more arduous with copper interconnects due to the intrinsic difficulty of etching copper material. Furthermore, these alternative etching methods are typically more complex than the generally accepted damascene approach. Thus, the idea of utilizing porous silica as the dielectric layer within a damascene structure has not been proven practical in the semiconductor industry at large.

Consequently, it would be desirable to provide a method for composing an improved dielectric layer within an interconnect structure of a multilayer IC device. This improved dielectric layer is required to have a very low dielectric constant and should also be able to withstand damage from a standard CMP procedure.

SUMMARY OF THE INVENTION

In accordance with a method of the present invention, a layer of silica precursor material is first deposited on a silicon substrate. Without affecting its structure and porosity, the layer of silica precursor material is then dried; and the layer of silica precursor material becomes porous silica film. Subsequently, a protective layer, such as parylene, is deposited oh top of the dried porous silica film. The thickness of the protective layer should be greater than the peak-valley planarization requirements of the silicon substrate surface. As a result, a composite porous silica film, which services as a dielectric layer within an interconnect structure, is formed. This composite porous silica film has a relatively low dielectric constant and is able to withstand damage from a standard CMP procedure.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1 is a cross-sectional view of an interconnect structure in accordance with a preferred embodiment of the present invention;

FIG. 2 is a cross-sectional view of an interconnect structure after a CMP process, in accordance with a preferred embodiment of the present invention;

FIG. 3 is a high-level logic flow diagram of a method for composing a dielectric layer within an interconnect structure, in accordance with a preferred embodiment of the present invention; and FIG. 4 is a pictorial illustration of a composite porous silica film after parylene deposition, in accordance with a preferred embodiment of the present invention.

DETAILED DESCRIPTION OF A PREFERRED EMBODIMENT

Referring now to the drawings and in particular to FIG. 1, there is illustrated a cross-sectional view of an interconnect structure 10 having a dual damascene structure 19, in accordance with a preferred embodiment of the present invention. To form a dual damascene structure 19, a dielectric layer 15 is formed on a substrate 16 using well-known deposition techniques such as chemical vapor deposition (CVD) or spin-on. Substrate 16 is preferably made of silicon. Two sequential photolithographic and reactive ion etch techniques are then utilized to remove portions of dielectric layer 15 to form dual damascene structure 19. As illustrated, dual damascene structure 19 includes two regions formed within dielectric layer 15, namely, a first region 11 and a second region 12. First region 11 is in contact with substrate 16, and second region 12 serves as a conductor. Thus, first region 11 of damascene structure 19 provides an electrical connection between substrate 16 and second region 12 of damascene structure 19.

First region 11 and second region 12 of dual damascene structure 19 have a width 23 and a width 24, respectively. Thus, dual damascene structure 19 has an aspect ratio that is defined as the sum of the height of first region 11 and the height of second region 12 divided by width 23 of first region 11. The dimensions of dual damascene structure 19 may vary, depending on the electrical requirements of interconnect structure 10. For example, second region 12 can be very wide (e.g., 20 microns) to provide a large current carrying capability or can be relatively small (e.g., 0.1 microns) to conserve space within an integrated device. Width 23 of first region 11 is generally limited by the photolithographic processing capability and by the ability to completely fill in first region 11.

After the formation of dual damascene structure 19, barrier layer 13 is formed along a side 17 of dual damascene structure 19 and on a top surface 18 of dielectric layer 15. Barrier layer 13 serves as a seed layer for retarding any out diffusion of copper (from a subsequent step) into dielectric layer 15. Barrier layer 13 can be formed utilizing a variety of techniques such as sputtering, evaporation, CVD, or plasma enhanced chemical vapor deposition (PECVD). Barrier layer 13 is an alloy that includes a variety of materials such as titanium, titanium nitride, and aluminum.

A conductive layer 14 is then deposited on top of barrier layer 13. Conductive layer 14 provides the conductive material utilized to form the metal line of second region 12. Following the formation of conductive layer 14, an anneal step is performed to diffuse a layer of copper throughout conductive layer 14. As such, a copper film 21 then forms a conductive layer overlying barrier layer 13. Because copper film 21 is formed on all surfaces of barrier layer 13, the distribution of copper is relatively even throughout dual damascene structure 19.

Subsequently, a polishing process such as a mechanical or a chemical-mechanical polishing (CMP) process is commonly utilized to physically remove any excess portions of conductive layer 14, copper film 21, and barrier layer 13 that are built on top surface 18 of dielectric layer 15, in order to define interconnect structure 10. After the polishing process, interconnect structure 10 has a metal line formed in a trench (i.e., second region 12) that is electrically coupled to substrate 16 by the via-like structure of first region 11, as shown in FIG. 2.

Referring now to FIG. 3, there is illustrated a high-level logic flow diagram of a method for composing dielectric layer 15 within interconnect structure 10, in accordance with a preferred embodiment of the present invention. Starting at block 30, a layer of silica precursor material is first deposited on a silicon wafer (i.e., substrate 16), as shown in block 31.

The deposition step is preferably performed by a spin-on process as is well-known to those skilled in the relevant art. The silica precursor material can be, for example, either tetraethylorthosilane (TEOS) gel or tetramethylorthosilicate (TMOS) gel. While retaining its structure and porosity, the layer of silica precursor material is then dried, as depicted in block 32; and the layer of silica precursor material becomes a layer of porous silica film. The drying step can be performed by various drying techniques that are well-known in the art. After the drying step, the entire silicon wafer is subsequently placed into a vacuum chamber for the deposition of parylene, as illustrated in block 33.

Parylene is a generic name and is commonly stored and handled in the form of solid dimers. For the present invention, three different dimers may be utilized, namely, di-para-xylylene, di-chloro di-para-xylylene, and tetra-chloro-di-para-xylylene. However, it should be understood that additional members of the parylene dimer family may also be found useful for the present invention. The above-mentioned dimers serve as precursors for producing parylene.

The deposition of parylene is preferably performed as follows. First, a batch of solid dimer di-para-xylylene is vaporized at 150° C. under a pressure of approximately 1 Torr. The dimer di-para-xylylene vapor is then converted by pyrolysis into monomeric para-xylylene, typically at a temperature in the range of 600° C. to 700° C. and under a pressure of approximately 0.5 Torr. In an attached chamber, the silicon wafer is exposed to the monomer para-xylylene at room temperature and at a pressure of approximately 100 mTorr. Initially, the monomeric para-xylylene condenses on the surface of the porous silica film that is on the silicon wafer. The monomeric para-xylylene then penetrates through the pores of the porous silica film and begins to polymerize. At this point, the pores of the porous silica film become filled with solid monomeric para-xylylene, and thus further penetration of monomeric para-xylylene is limited. The polymerization process then proceeds on the surface of the porous silica film, and the parylene film can be grown to the desired thickness. The thickness of the protective parylene cap layer should preferably be greater than the peak-to-valley planarization requirement of the surface of the silicon wafer.

With reference now to FIG. 4, there is depicted a pictorial illustration of a composite porous silica film after a parylene disposition, in accordance with a preferred embodiment of the present invention. As shown, a composite porous silica film 40 includes three distinguishable layers, namely, a parylene layer 41, a composite layer 42, and a porous silica layer 43. Parylene layer 41 is formed on top of composite layer 42. Composite layer 42 includes a composite interlayer of para-xylylene deposited within the pores of porous silica film 40. Porous silica layer 43 is the original porous silica composition. The thickness of composite layer 42 is determined by the pore size of the porous silica film, the exact temperature of the silicon wafer, the exact chemical properties of the pary-xylylene monomer, and the rate of deposition. For a typical porous silica film having an average pore size distribution of approximately 60–200 nm, utilizing a di-para-xylylene monomer deposited at a temperature of 20° C. and at a pressure of 100 mTorr, a composite layer thickness of 100 to 400 nm would be achieved.

Although the length of the deposition process governs the thickness of parylene layer 41, the final thickness of parylene layer 41 is controlled by the duration and removal rate of the CMP process, with the requirement that the CMP process remove only parylene layer 41 and leave the underlying composite layer 42 substantially intact. The dielectric constant for pure bulk parylene is approximately 2.5, which is considered acceptable when utilized in conjunction with a porous silica film as described above from a device performance point of view.

As has been described, the present invention provides a method for composing an improved dielectric layer within an interconnect structure of a multilayer semiconductor device. Contrary to the teachings of prior art, the present invention provides a novel method of integrating porous silica into a damascene process flow that is commonly utilized within the semiconductor industry. Although a dielectric layer within an interconnect structure is utilized to illustrate a preferred embodiment of the present invention, the principle as disclosed can also be applicable to any other IC structure having dielectric constant aerogel-type films.

While the invention has been particularly shown and described with reference to a preferred embodiment, it will be understood by those skilled in the art that various changes in form and detail may be made therein without departing from the spirit and scope of the invention.

What is claimed is:

1. A method for comprising a dielectric layer with in an interconnect structure of a semiconductor device, said method comprising the steps of:

depositing a layer of silica precursor material on a silicon substrate;

drying said layer of silica precursor material while retaining microstructure and porosity form a porous silica film; and depositing protective layer on said porous silica film, wherein a thickness of said protective layer is greater than a peak-valley planarization requirement of a surface of said silicon substrate.

2. The method according to claim 1, wherein said depositing step is performed by a spin-on process.

3. The method according to claim 1, wherein said silica precursor material can be either tetraethylorthosilane gel or tetramethylorthosilicate gel.

4. The method according to claim 1, wherein said step of depositing a protective layer is performed at room temperature and at a pressure of approximately 100 mTorr.

5. The method according to claim 1, wherein said protective layer may be formed by di-para-xylylene, di-chloro di-para-xylylene, or tetra-chloro-di-para-xylylene dimers.

* * * * *